United States Patent
Yoshikawa et al.

(10) Patent No.: US 9,919,931 B2
(45) Date of Patent: Mar. 20, 2018

(54) ZINC OXIDE SPUTTERING TARGET

(71) Applicant: NGK Insulators, Ltd., Nagoya-Shi (JP)

(72) Inventors: Jun Yoshikawa, Nagoya (JP); Katsuhiro Imai, Nagoya (JP); Koichi Kondo, Nagoya (JP); Koki Kanno, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 170 days.

(21) Appl. No.: 14/848,842

(22) Filed: Sep. 9, 2015

(65) Prior Publication Data

US 2015/0376024 A1    Dec. 31, 2015

Related U.S. Application Data

(63) Continuation of application No. PCT/JP2013/083605, filed on Dec. 16, 2013.

(30) Foreign Application Priority Data

Mar. 25, 2013 (JP) .................................. 2013-061450
Sep. 30, 2013 (JP) .................................. 2013-203500

(51) Int. Cl.
| | | |
|---|---|---|
| C01G 9/00 | (2006.01) | |
| C01G 9/02 | (2006.01) | |
| C04B 35/453 | (2006.01) | |
| C23C 14/08 | (2006.01) | |
| C23C 14/34 | (2006.01) | |

(52) U.S. Cl.
CPC .............. *C01G 9/02* (2013.01); *C04B 35/453* (2013.01); *C23C 14/086* (2013.01); *C23C 14/3407* (2013.01); *C23C 14/3414* (2013.01); *C01P 2002/90* (2013.01); *C01P 2004/20* (2013.01); *C01P 2004/54* (2013.01); *C01P 2004/61* (2013.01); *C01P 2004/62* (2013.01); *C01P 2006/10* (2013.01); *C01P 2006/80* (2013.01); *C04B 2235/322* (2013.01); *C04B 2235/3284* (2013.01); *C04B 2235/5445* (2013.01); *C04B 2235/6025* (2013.01); *C04B 2235/77* (2013.01); *C04B 2235/787* (2013.01); *C04B 2235/788* (2013.01)

(58) Field of Classification Search
CPC .............. C23C 14/3407; C23C 14/086; C23C 14/3414; C01G 9/02; C04B 35/453; H01J 37/3414; H01J 37/3426; H01J 37/3423
See application file for complete search history.

(56) References Cited

U.S. PATENT DOCUMENTS

2009/0101493 A1*  4/2009  Nakayama .......... C04B 35/453
                                                  204/192.11

FOREIGN PATENT DOCUMENTS

| EP | 0 486 182 A1 | 5/1992 |
|---|---|---|
| JP | 06-088218 A1 | 3/1994 |
| JP | 11-279754 A1 | 10/1999 |
| JP | 3301755 B2 | 7/2002 |
| JP | 2009-215629 A1 | 9/2009 |
| JP | 2011-179056 A1 | 9/2011 |
| JP | 4894293 B2 | 3/2012 |

OTHER PUBLICATIONS

International Search Report and Written Opinion (Application No. PCT/JP2013/083605) dated Mar. 4, 2014 (with English translation).

* cited by examiner

*Primary Examiner* — Steven J Bos
(74) *Attorney, Agent, or Firm* — Burr & Brown, PLLC

(57) ABSTRACT

Provided is a zinc oxide-based sputtering target capable of improving the film formation rate while suppressing arcing in the formation of a zinc oxide-based transparent conductive film by sputtering. This zinc oxide-based sputtering target includes a zinc oxide-based sintered body mainly including zinc oxide crystal grains, and has a degree of (002) orientation of 50% or greater at a sputtering surface and a density of 5.30 g/cm$^3$ or greater.

5 Claims, No Drawings

ZINC OXIDE SPUTTERING TARGET

CROSS-REFERENCE TO RELATED APPLICATIONS

This application is a continuation application of PCT/JP2013/083605 filed Dec. 16, 2013, which claims priority to Japanese Patent Application No. 2013-061450 filed Mar. 25, 2013 and Japanese Patent Application No. 2013-203500 filed Sep. 30, 2013, the entire contents all of which are incorporated herein by reference.

BACKGROUND OF THE INVENTION

1. Field of the Invention

The present invention relates to a zinc oxide-based sputtering target.

2. Description of the Related Art

As a transparent conductive film for use in, for example, electronic devices, indium tin oxide (ITO) and the like have been widely used for many years. However, due to recent price increase of rare metals such as indium, rare-metal alternatives are strongly desired. Accordingly, attempts have been actively made in recent years to use less expensive zinc oxide (ZnO) for producing transparent conductive films, but ZnO is not yet extensively used because there are various problems, for example, the resistance is not sufficiently lowered, and a desired electrical conductivity cannot be obtained. Therefore, a zinc oxide film with higher transparency and electrical conductivity is desired as a transparent conductive material that substitutes for ITO.

Industrially, transparent conductive films are mainly produced by sputtering. However, when forming a zinc oxide-based transparent conductive film by sputtering, abnormal electrical discharge called arcing may occur. Since arcing deteriorates the quality of zinc oxide film, impairs transparency and electrical conductivity, and also damages the underlying functional layer, it is important to suppress arcing during sputtering. Moreover, in order to achieve high productivity, a high film formation rate is also required.

A sputtering target having a decreased sintered grain diameter to address the arcing problem is known. For example, Patent Document 1 (JP 4894293B) discloses an ITO or AZO (aluminum-doped zinc oxide) sintered body that is sintered by electromagnetic wave heating and that has a thickness of 10 mm or greater, a sintered grain diameter of 0.5 µm to 2 µm, and an average sintered density of the entire sintered body of 99% or greater in terms of relative density.

It is also known that a highly uniform film can be obtained by sputtering with a sputtering target composed of (002) plane-oriented zinc oxide. For example, Patent Document 2 (JP 3301755B) discloses an electrically conductive zinc oxide sintered body having an average sintered grain diameter of 1 µm to 10 µm, a volume resistivity of less than 10 $\Omega$·cm, a density of 4.0 g/cm$^3$ or greater and less than 5.0 g/cm$^3$, and (002) crystal orientation greater than (101) crystal orientation. Patent Document 3 (JP H6-88218A) discloses a zinc oxide-based sintered body having (002) crystal orientation greater than (101) crystal orientation and a density of 4.5 g/cm$^3$ or greater. However, the object of Patent Documents 2 and 3 is to form a low-resistance film or to form a film with a small resistance distribution on a low-temperature substrate, and is not to address the arcing and film formation rate problems.

On the other hand, as a technique for producing an oriented sintered body, it is known to use a plate-like raw material powder with a particle diameter of several micrometers and to array plate-like particles by pressing or the like (for example, Patent Document 4 (JP 2009-215629A)).

CITATION LIST

Patent Documents

Patent Document 1: JP 4894293B
Patent Document 2: JP 3301755B
Patent Document 3: JP H6-88218A
Patent Document 4: JP 2009-215629A

SUMMARY OF THE INVENTION

The inventors have currently found that configuring a zinc oxide-based sputtering target to have a degree of (002) orientation of 50% or greater at the sputtering surface and to have a density of 530 g/cm$^3$ or greater makes it possible to improve the film formation rate while suppressing arcing in the formation of a zinc oxide-based transparent conductive film by sputtering.

Accordingly, an object of the present invention is to provide a zinc oxide-based sputtering target capable of improving the film formation rate while suppressing arcing in the formation of a zinc oxide-based transparent conductive film by sputtering.

According to an aspect of the present invention, there is provided a zinc oxide-based sputtering target, comprising a zinc oxide-based sintered body mainly comprising zinc oxide crystal grains, wherein the zinc oxide-based sputtering target has a degree of (002) orientation of 50% or greater at a sputtering surface and has a density of 5.30 g/cm$^3$ or greater.

DETAILED DESCRIPTION OF THE INVENTION

Zinc Oxide-Based Sputtering Target

The zinc oxide-based sputtering target according to the present invention comprises a zinc oxide-based sintered body mainly comprising zinc oxide crystal grains and has a degree of (002) orientation of 50% or greater at a sputtering surface and has a density of 5.30 g/cm$^3$ or greater. Such a configuration makes it possible to improve the film formation rate while suppressing arcing in the formation of a zinc oxide-based transparent conductive film by sputtering. Although the mechanism is not necessarily clear, it is considered as follows. That is, since arcing is considered to occur due to the concentration of an electrical field at protrusions of a target during sputtering, the use of a crystallographically oriented target results in uniform target depletion, which diminishes generation of protrusions to reduce arcing. Moreover, the (002) plane is considered to be a crystal plane that is easily sputtered, and an increased degree of orientation results in an increase of the film formation rate. In any case, by suppressing arcing and improving the film formation rate, a high-quality zinc oxide transparent conductive film can be produced at a high productivity level. In addition, satisfying the aforementioned degree of orientation and density is advantageous in improving the moisture resistance of the film as well.

The zinc oxide-based sintered body mainly comprises zinc oxide crystal grains. The phrase "mainly comprises zinc oxide crystal grains" means that zinc oxide crystal grains constitute the main phase, and a small amount of heterogeneous phase and/or impurity may be contained, and is intended for a zinc oxide-based sintered body comprising zinc oxide crystal grains typically in a proportion of about 70 mass % or greater, more typically 80 mass % or greater, and even more typically 90 mass % or greater. The zinc oxide-based sintered body is a solid in which a countless number of zinc oxide crystal grains are bonded to each other due to sintering. Zinc oxide crystal grains contain zinc oxide and may contain as another element or impurity, Zr and/or Na which will be described below as well as a dopant such as a group 3B element, e.g. Al or Ga, and inevitable impurities, or may be composed of zinc oxide and inevitable impurities. Such other elements may be substituted at the Zn site and the 0 site of the hexagonal wurtzite structure, may be contained as additive elements that do not constitute the crystal structure, or may exist at grain boundaries. Also, the zinc oxide-based sintered body may contain a heterogeneous phase or another element such as one stated above in addition to zinc oxide crystal grains, and the zinc oxide-based sintered body may consist essentially of (or consist of) zinc oxide crystal grains and inevitable impurities.

It is preferable that the zinc oxide-based sintered body comprises a small amount of Zr and/or Na as an impurity. Although such an impurity may not be preferable in semiconductor or like applications, such an impurity is not particularly problematic in CIGS solar cells or the like. Although the mechanism is unclear, a small amount of Zr and/or Na can rather contribute to reducing arcing and improving the film formation rate. It is presumed that both elements have the effect of enhancing grain boundary strength and preventing falling-off of grains from the target surface. It is preferable that the zinc oxide-based sintered body comprises no less than 100 ppm of Zr, more preferably 100 to 2000 ppm, and even more preferably 200 to 1000 ppm. It is preferable that the zinc oxide-based sintered body comprises no less than 10 ppm of Na, more preferably 15 to 100 ppm, and even more preferably 20 to 80 ppm.

The zinc oxide-based sintered body of the present invention has a degree of (002) orientation of 50% or greater at the sputtering surface, preferably 75% or greater, more preferably 85 or greater, and even more preferably 90% or greater. Since the (002) plane is considered to be a crystal plane that is easily sputtered, the higher the degree of (002) orientation is, the higher the film formation rate can be while suppressing arcing. Therefore, the upper limit of the degree of (002) orientation at the sputtering surface should not be particularly limited, and is ideally 100%. This degree of orientation of the (002) plane was determined by measuring an XRD profile through irradiating the surface of a disc-like zinc oxide-based sintered body with X rays using an XRD apparatus (trade name "RINT-TTR III" manufactured by Rigaku Corporation). The degree of (002) orientation is calculated according to the following formulae.

$$\text{Degree of (002) orientation [\%]} = \frac{p - p_0}{1 - p_0} \times 100 \quad \text{[Formula 1]}$$

$$p_0 = \frac{I_0(002)}{I_0(100) + I_0(002) + I_0(101)}$$

$$p = \frac{I_s(002)}{I_s(100) + I_s(002) + I_s(101)}$$

where $I_0(hkl)$ and $I_s(hkl)$ are diffraction intensities (integral values) of the (hkl) planes in ICDD No. 361451 and a sample, respectively The zinc oxide-based sputtering target has a density of 5.30 g/cm³ or greater, preferably 5.40 g/cm³ or greater, and more preferably 5.50 g/cm³ or greater. Such a high density makes it easy to simultaneously achieve suppression of arcing and improvement of film formation rate during sputtering.

It is preferable that the zinc oxide crystal grains have an aspect ratio of 5.0 or less in a cross-section perpendicular to the sputtering surface, more preferably 4.0 or less, and even more preferably 1.0 to 3.0. This aspect ratio is the ratio of the length (in the direction parallel to the sputtering surface)/the length (in the direction perpendicular to the sputtering surface), and a ratio within the above range is particularly advantageous to simultaneously achieving suppression of arcing and improvement of film formation rate during sputtering. Although the reason is not necessarily clear, it is presumed that zinc oxide crystal grains are unlikely to fall off from the target surface because of the small aspect ratio as above. This is presumably associated with the fact that concerning the grains that exist at the target surface, the proportion of the area of grains exposed to the target surface to the grain volume is small when the aspect ratio is small. On the other hand, an oriented sintered body is normally produced by using a plate-like raw material powder having a particle diameter of several micrometers and arraying plate-like particles by pressing or the like (for example, Patent Document 4), and crystal grains of the oriented sintered body produced by such a method normally have a large aspect ratio. In this case, it is considered that concerning the grains that exist at the target surface during sputtering, the proportion of the area of grains exposed to the target surface to the grain volume is large, and the grains easily fall off from the target surface.

In the present invention, the aspect ratio can be determined as follows. That is, an about 10 mm cube sample is cut out from a disc-like sintered body, a surface perpendicular to the disc surface is polished and subjected to etching in 0.3 M nitric acid for 10 seconds, and then an image is taken with a scanning electron microscope. The visual field range is determined in such a way that when straight lines parallel and perpendicular to the disc surface are drawn, each straight line crosses 10 to 30 grains. The aspect ratio is determined by: drawing three straight lines parallel to the disc surface; taking the average of the line segment lengths inside all grains crossed by the straight lines; multiplying the average by 1.5 to give a value regarded as $a_1$; similarly, drawing three straight lines perpendicular to the disc surface; taking the average of the line segment lengths inside all grains crossed by the straight lines; multiplying the average by 1.5 to give a value regarded as $a_2$; and calculating $a_1/a_2$. Small grains (the diameter of the inscribed circle of which is 500 nm or less), which presumably constitute a heterogeneous phase different from ZnO, are excluded from the measurement target grains.

Production Method

The zinc oxide-based sputtering target according to the present invention may be produced by any method as long as desired properties are obtained. Preferably, a highly oriented zinc oxide-based sintered body can be prepared by preparing a plate-like zinc oxide powder, applying shearing force to this plate-like zinc oxide powder to form an oriented green body, and firing this oriented green body. This preferable production method will now be described below.

(1) Preparation of Plate-Like Zinc Oxide Powder

First, plate-like zinc oxide precursor particles are produced by a solution method using a zinc ion-containing raw material solution. Examples of zinc ion sources include zinc sulfate, zinc nitrate, zinc chloride, organic acid salts such as zinc acetate, zinc alkoxides, and the like. Zinc sulfate is preferable because it can also supply sulfate ions, which will be described below. A production technique for plate-like zinc oxide precursor particles by a solution method is not particularly limited, and production can be performed according to a known technique.

It is preferable that the raw material solution comprises a water-soluble organic material and sulfate ions because a porous material having a large specific surface area can be obtained. Examples of the water-soluble organic material include alcohols, polyols, ketones, polyethers, esters, carboxylic acids, polycarboxylic acids, celluloses, saccharides, sulfonic acids, amino acids, and amines, and more specifically, aliphatic alcohols such as methanol, ethanol, propanol, butanol, pentanol, and hexanol; aliphatic polyhydric alcohols such as ethylene glycol, propanediol, butanediol, glycerine, polyethylene glycol, and polypropylene glycol; aromatic alcohols such as phenol, catechol, and cresol; alcohols having a heterocycle such as furfuryl alcohol; ketones such as acetone, methyl ethyl ketone, and acetylacetone; ethers or polyethers such as ethyl ether, tetrahydrofuran, dioxane, polyoxyalkylene ether, ethylene oxide adduct, and propylene oxide adduct; esters such as ethyl acetate, ethyl acetoacetate, and glycine ethyl ester; carboxylic acids, polycarboxylic acids, or hydroxycarboxylic acids, such as formic acid, acetic acid, propionic acid, butanoic acid, butyric acid, oxalic acid, malonic acid, citric acid, tartaric acid, gluconic acid, salicylic acid, benzoic acid, acrylic acid, maleic acid, glyceric acid, eleostearic acid, polyacrylic acid, polymaleic acid, and acrylic acid-maleic acid copolymer, and salts thereof; carboxymethylcelluloses; monosaccharides such as glucose and galactose; polysaccharides such as sucrose, lactose, amylose, chitin, and cellulose; sulfonic acids such as alkylbenzenesulfonic acid, para-toluenesulfonic acid, alkylsulfonic acid, α-olefinsulfonic acid, polyoxyethylenealkylsulfonic acid, ligninsulfonic acid, and naphthalenesulfonic acid, and salts thereof; amino acids such as glycine, glutamic acid, aspartic acid, and alanine; hydroxyamines such as monoethanolamine, diethanolamine, triethanolamine, and butanolamine; trimethyl aminoethyl alkylamide; alkylpyridinium sulfuric acid salts; alkyltrimethylammonium halides; alkylbetaines; alkyl diethylene triamino acetic acids; and the like. Among these water-soluble organic materials, those that have at least one functional group from a hydroxyl group, a carboxyl group, and an amino group are preferable, and hydroxycarboxylic acids having a hydroxyl group and a carboxyl group and salts thereof are particularly preferable, with examples being sodium gluconate, tartaric acid, and the like. It is preferable that the water-soluble organic material is concomitantly present in a range of about 0.001 wt % to about 10 wt % in an aqueous ammonia-added raw material solution, which will be described below. A preferable sulfate ion source is zinc sulfate as stated above. The raw material solution may further comprise the above-described additive substance such as a dopant.

At this time, the raw material solution is preferably heated to a preliminary reaction temperature of 70 to 100° C. and more preferably 80 to 100° C. After or during this heating, aqueous ammonia is preferably added to the raw material solution, and the raw material solution to which aqueous ammonia has been added is preferably kept at a temperature of 70 to 100° C. for 0.5 to 10 hours and more preferably at a temperature of 80 to 100° C. for 2 to 8 hours.

Next, the plate-like precursor particles are calcined by increasing the temperature to a calcination temperature at a rate of 150° C./h or lower to produce a zinc oxide powder composed of a plurality of plate-like zinc oxide particles. It is considered that by lowering the rate of temperature increase to 150° C./h or lower, the crystal plane of the precursor material is easily inherited by zinc oxide when the precursor material changes into zinc oxide, thus resulting in an enhanced degree of orientation of plate-like particles in a green body. Also, it is considered that the connectivity of primary particles to each other is enhanced, and plate-like particles are thus unlikely to collapse. A preferable rate of temperature increase is 120° C./h or lower, more preferably 100° C./h or lower, even more preferably 50° C./h or lower, particularly preferably 30° C./h or lower, and most preferably 15° C./h or lower. The zinc oxide precursor particles are preferably washed, filtered, and dried before calcination. The calcination temperature is not particularly limited as long as the precursor compound such as zinc hydroxide can change into zinc oxide, and the calcination temperature is preferably 800 to 1100° C. and more preferably 850 to 1000° C. The plate-like precursor particles are retained at such a calcination temperature preferably for 0 to 3 hours and more preferably for 0 to 1 hour. Such temperature retaining conditions enable the precursor compound such as zinc hydroxide to change more reliably into zinc oxide. Due to such a calcination step, the plate-like precursor particles change into plate-like zinc oxide particles that have many pores.

Optionally, the zinc oxide powder may be mixed with an additive substance. Such additive substances may be, as secondary components, various additive agents or dopants as described above, which impart properties (such as electroconductive or insulative properties) desired depending on the use or the specification of a green body. Preferable examples of dopant elements include B, Al, Ga, In, C, F, Cl, Br, I, H, Li, Na, K, N, P, As, Cu, Ag, Zr, and any combinations of these, and Al and/or Ga are more preferable. These dopant elements may be added in the form of compounds containing these elements or in the form of ions to the zinc oxide powder. A method for adding the additive substance is not particularly limited, but in order to allow the additive substance to reach the interior of the fine pores of the zinc oxide powder, preferable examples thereof include (1) a method in which the additive substance is added in the form of a fine powder such as nanoparticles to the zinc oxide powder; (2) a method in which the additive substance is dissolved in a solvent and then added to the zinc oxide powder followed by drying this solution; and so on.

(2) Preparation of Zinc Oxide-Based Sintered Body

Using the above zinc oxide powder, a highly oriented zinc oxide green body and zinc oxide-based sintered body can be prepared. That is, since this zinc oxide powder is composed of plate-like particles, a green body with oriented plate-like particles can be obtained by preparing a green body using a shaping method such as tape casting or extrusion molding in which shearing force is applied to plate-like particles. Also, sintering such a highly oriented green body makes it possible to obtain a highly oriented sintered body. In addition, since an additive substance can be uniformly dispersed in this zinc oxide green body and zinc oxide-based sintered body, it is possible to exert to the maximum extent the desired properties that are to be imparted by the additive substance. In the case where the zinc oxide powder does not contain the above-described additive substance, the additive substance may be added when preparing a green body, and addition of the additive substance can be also performed as described above.

The zinc oxide powder is oriented by a technique using shearing force to provide an oriented green body. Preferable examples of techniques using shearing force include tape casting, extrusion molding, a doctor blade method, and any combination of these. Regarding the orientation techniques using shearing force, in any of the techniques exemplified above as well, it is preferable that additives such as a binder, a plasticizer, a dispersant, and a dispersion medium are suitably added to the plate-like zinc oxide powder to form a slurry, and this slurry is passed through a slit-like narrow discharge port to discharge and shape the slurry into a sheet form on a substrate. The slit width of the discharge port is preferably 10 to 400 μm. The amount of dispersion medium is preferably such an amount that the slurry viscosity is 5000 to 100000 cP and more preferably 8000 to 60000 cP. The thickness of the oriented green body shaped into a sheet form is preferably 5 to 500 μm and more preferably 10 to 200 μm. It is preferable that multiple pieces of this oriented green body that has been shaped into a sheet form are stacked to form a precursor laminate having a desired thickness, and this precursor laminate is subjected to pressing. This pressing can be preferably performed by packaging the precursor laminate in a vacuum pack or the like and subjecting it to isostatic pressing in hot water at a temperature of 50 to 95° C. under a pressure of 10 to 2000 kgf/cm². When extrusion molding is used, a flow channel in a metal mold may be designed such that the slurry passes through a narrow discharge port inside the metal mold, then pieces of a green body in a sheet form are integrated into a single body in the metal mold, and the green body is discharged in a laminated state. It is preferable to degrease the resulting green body in accordance with known conditions.

The oriented green body obtained as described above is fired at a firing temperature of 1000 to 1500° C. and preferably 1100 to 1450° C. to form a zinc oxide-based sintered body comprising oriented plate-like zinc oxide particles. The firing time at the aforementioned firing temperature is not particularly limited, and is preferably 1 to 10 hours and more preferably 2 to 5 hours. The zinc oxide-based sintered body obtained in this way has a high degree of (002) orientation at the plate surface, and the degree of orientation is preferably 50% or greater, more preferably 75% or greater, even more preferably 85% or greater, and particularly preferably 90% or greater.

EXAMPLES

The present invention will now be more specifically described by way of the following examples.

Example 1

(1) Preparation of Plate-Like Zinc Oxide Powder 1730 g of zinc sulfate heptahydrate (manufactured by Kojundo Chemical Laboratory Co., Ltd.) and 4.5 g of sodium gluconate (manufactured by Wako Pure Chemical Industries, Ltd.) were dissolved in 3000 g of ion exchanged water. This solution was placed in a beaker and heated to 90° C. while being stirred with a magnetic stirrer. While this solution was kept at 90° C. and stirred, 490 g of 25% aqueous ammonia was added dropwise with a microtube pump. After the end of dropwise addition, the solution was kept at 90° C. for 4 hours while being stirred, and then left to stand still. The precipitates were separated by filtration, further, were washed with ion exchanged water 3 times, and were dried to give a zinc oxide precursor material in the form of a white powder. 100 g of the resulting zinc oxide precursor material was placed on a zirconia plate and calcined in air in an electric furnace to give 65 g of a plate-like porous zinc oxide powder. The temperature schedule during calcination was as follows: the temperature was increased at a rate of 100° C./h from room temperature to 900° C., then kept at 900° C. for 30 minutes, and cooled naturally. The resulting plate-like zinc oxide powder was ground with a ball mill to an average particle diameter of 1.0 μm using $ZrO_2$ balls.

(2) Preparation of Zinc Oxide-Based Sintered Body 2 parts by weight of δ-alumina (manufactured by Sumitomo Chemical Co., Ltd.) was added to and dispersed in 200 parts by weight of ethanol. 98 parts by weight of the plate-like zinc oxide particles obtained by the above method was added thereto, this mixture was dried by using a rotary evaporator, and thereby plate-like zinc oxide particles in which the aluminum component was uniformly dispersed were prepared. 100 parts by weight of the resulting mixed powder was mixed with 15 parts by weight of a binder (polyvinyl butyral: Part No. BM-2, manufactured by Sekisui Chemical Co., Ltd.), 6.2 parts by weight of a plasticizer (DOP: di(2-ethylhexyl)phthalate, manufactured by Kurogane Kasei Co., Ltd.), 3 parts by weight of a dispersant (trade name: Rheodol SP-030, manufactured by Kao Corporation), and a dispersion medium (2-ethylhexanol). The amount of the dispersion medium was adjusted such that the slurry viscosity was 10000 cP. The slurry thus prepared was applied onto a PET film by a doctor blade method to form a sheet having a thickness after drying of 20 μm. The resulting tape was cut, stacked, placed on an aluminum plate having a thickness of 10 mm, and then vacuum-packed. This vacuum pack was subjected to isostatic pressing in hot water at 85° C. under a pressure of 100 kgf/cm² to prepare a disc-like green body having a diameter of 190 mm and a thickness of 6 mm. The resulting green body was placed in a degreasing furnace and degreased at 600° C. for 20 hours. The resulting degreased body was fired under atmospheric pressure at 1400° C. for 5 hours in nitrogen to give a disc-like zinc oxide-based sintered body as a sputtering target.

(3) Evaluation of Degree of Orientation

The degree of (002) orientation was measured by XRD using the plate surface of the disc-like sintered body as a sample surface. This measurement was performed by measuring an XRD profile through irradiating the surface of the disc-like zinc oxide-based sintered body with X rays using an XRD apparatus (trade name "RINT-TTR III" manufactured by Rigaku Corporation). The degree of (002) orientation was calculated according to the following formulae. The value of the degree of orientation in this example was 85%.

$$\text{Degree of (002) orientation [\%]} = \frac{p - p_0}{1 - p_0} \times 100 \qquad \text{[Formula 2]}$$

$$p_0 = \frac{I_0(002)}{I_0(100) + I_0(002) + I_0(101)}$$

$$p = \frac{I_s(002)}{I_s(100) + I_s(002) + I_s(101)}$$

where $I_0(hkl)$ and $I_s(hkl)$ are diffraction intensities (integral values) of the (hkl) planes in ICDD No. 361451 and a sample, respectively (4) Measurement of Aspect Ratio The aspect ratio of zinc oxide crystal grains constituting the zinc oxide-based sintered body was measured by the following method. An about 10 mm cube sample was cut out from the disc-like sintered body, a surface perpendicular to the disc surface was polished and subjected to etching in 0.3 M nitric acid for 10 seconds, and then an image was taken with a scanning electron microscope. The visual field range was determined in such a way that when straight lines parallel and perpendicular to the disc surface were drawn, each straight line crossed 10 to 30 grains. The aspect ratio was determined by: drawing three straight lines parallel to the disc surface; taking the average of the line segment lengths inside all grains crossed by the straight lines; multiplying the average by 1.5 to give a value regarded as $a_1$; similarly, drawing three straight lines perpendicular to the disc surface; taking the average of the line segment lengths inside all grains crossed by the straight lines; multiplying the average by 1.5 to give a value regarded as $a_2$; and calculating $a_1/a_2$. Small grains (the diameter of the inscribed circle of which was 500 nm or less), which presumably constituted a heterogeneous phase different from ZnO, were excluded from the measurement target grains. Results are shown in Table 1.

(5) Measurement of Zr Content and Na Content

The Zr and Na contents in the zinc oxide-based sintered body were each measured by inductively coupled plasma (ICP) emission spectroscopy. Results are shown in Table 1.

(6) Evaluation of Sputtering

Another disc-like sintered body prepared under the same conditions as above was bonded to a copper backing plate with indium. Using this bonded plate as a target, sputtering was performed with a DC magnetron sputtering apparatus in a pure Ar atmosphere under a pressure of 0.5 Pa at a power supply of 150 W. Specifically, after performing pre-sputtering for 5 hours, a film was formed on a glass substrate by sputtering for 30 minutes. The arcing rate was determined by counting the number of times of abnormal electrical discharge visually observed during the film formation and multiplying the number by 2 with the unit being [count/hour]. Also, the film formation rate was determined by dividing the film thickness measured with an interference thickness meter by 30, with the unit being [nm/min]. Results are shown in Table 1.

(7) Measurement of Film Resistivity Increase Ratio after Moisture Resistance Test Another disc-like sintered body prepared under the same conditions as above was bonded to a copper backing plate with indium. Using this bonded plate as a target, sputtering was performed with a DC magnetron sputtering apparatus at a substrate temperature of 200° C. in an Ar atmosphere under a sputtering gas pressure of 0.5 Pa at a power supply of 150 W. Specifically, after performing pre-sputtering for 5 hours, a film was formed on an alkali-free glass substrate (Corning Eagle XG) by sputtering. The film resistivity of the resulting 300 nm thick sputtered film was measured by a four-point probe method using a resistivity meter (manufactured by Mitsubishi Chemical Corporation, Loresta EP). After the measurement, a moisture resistance test was performed on the sputtered film. This moisture resistance test was performed by keeping the sputtered film under 60° C. and 90% RH conditions for 300 hours. The film resistivity of the sputtered film after the moisture resistance test was measured as above, and then the film resistivity increase ratio after the moisture resistance test was calculated according to the following formula: (Film resistivity increase ratio after moisture resistance test)=(Film resistivity after moisture resistance test)/(Film resistivity before moisture resistance test). Results are shown in Table 1.

Example 2

A disc-like sintered body was prepared and evaluated in the same manner as in Example 1 except that in the preparation of plate-like zinc oxide powder, the powder was ground with a ball mill to an average particle diameter of 0.6 µm. Results were as shown in Table 1.

Example 3

A disc-like sintered body was prepared and evaluated in the same manner as in Example 1 except that in the preparation of plate-like zinc oxide powder, the powder was ground with a ball mill to an average particle diameter of 1.5 µm. Results were as shown in Table 1.

Example 4 (Comparative)

A disc-like sintered body was prepared and evaluated in the same manner as in Example 1 except that in the preparation of plate-like zinc oxide powder, the powder was ground with a ball mill to an average particle diameter of 3.0 µm. Results were as shown in Table 1.

Example 5 (Comparative)

A disc-like sintered body was prepared and evaluated in the same manner as in Example 1 except that a commercially available powder (manufactured by Seido Chemical Industry Co., Ltd., zinc oxide alone, average particle diameter of 0.6 µm) was used as zinc oxide raw material. Results were as shown in Table 1.

Example 6

A disc-like sintered body was prepared and evaluated in the same manner as in Example 1 except that in the preparation of plate-like zinc oxide powder, the powder was ground with a ball mill to an average particle diameter of 2.0 µm, the viscosity of the slurry used in preparing a green body sheet was 8000 cP, and in firing, the green body was fired under atmospheric pressure by keeping it at 1100° C. for 10 hours and then 1400° C. for 5 hours. Results were as shown in Table 1.

Example 7

A disc-like sintered body was prepared and evaluated in the same manner as in Example 1 except that in the preparation of plate-like zinc oxide powder, the powder was ground with a ball mill to an average particle diameter of 3.5 µm, the viscosity of the slurry used in preparing a green body sheet was 6000 cP, and in firing, the green body was fired under atmospheric pressure by keeping it at 1100° C. for 30 hours and then 1400° C. for 5 hours. Results were as shown in Table 1.

Example 8

A disc-like sintered body was prepared and evaluated in the same manner as in Example 2 except that the viscosity of the slurry used in preparing a green body sheet was 25000 cP. Results were as shown in Table 1.

Example 9 (Comparative)

A disc-like sintered body was prepared and evaluated in the same manner as in Example 2 except that the viscosity of the slurry used in preparing a green body sheet was 5000 cP. Results were as shown in Table 1.

TABLE 1

|  | Degree of (002) orientation [%] | Density [g/cm³] | Grain diameter aspect ratio | Zr content [ppm] | Na content [ppm] | Arcing [count/hour] | Film formation rate [nm/min] | Film resistivity increase ratio after moisture resistance test |
|---|---|---|---|---|---|---|---|---|
| Ex. 1 | 85 | 5.55 | 2.5 | 640 | 30 | 2 | 98 | 1.06 |
| Ex. 2 | 60 | 5.59 | 1.9 | 800 | 28 | 4 | 90 | 1.05 |
| Ex. 3 | 92 | 5.45 | 3.4 | 320 | 34 | 2 | 95 | 1.04 |
| Ex. 4* | 92 | 5.25 | 5.2 | 90 | 26 | 25 | 78 | 1.49 |
| Ex. 5* | 2 | 5.56 | 1.1 | — | <10 | 18 | 75 | 1.35 |
| Ex. 6 | 86 | 5.54 | 4.5 | 92 | 29 | 6 | 98 | 1.06 |
| Ex. 7 | 85 | 5.56 | 5.8 | 74 | 38 | 8 | 97 | 1.08 |
| Ex. 8 | 88 | 5.58 | 0.9 | 450 | 26 | 6 | 100 | 1.09 |
| Ex. 9* | 45 | 5.55 | 1.7 | 890 | 22 | 15 | 79 | 1.28 |

*indicates comparative examples.

From the results shown in Table 1, it can be understood that the film formation rate can be improved while suppressing arcing by sputtering using a zinc oxide-based sputtering target having a degree of (002) orientation of 50% or greater and a density of 5.30 g/cm³ or greater. In addition, it can also be understood that by satisfying the aforementioned degree of orientation and density, the film resistance increase ratio after the moisture resistance test is greatly lowered, i.e., the moisture resistance of the film is improved. Although the reason why the moisture resistance of the film was improved is not clear, it is presumed that atoms sputtered from the highly dense (002) plane formed a high-quality film, and thereby the reaction with moisture was suppressed, resulting in improved moisture resistance.

What is claimed is:

1. A zinc oxide-based sputtering target, comprising a zinc oxide-based sintered body mainly comprising zinc oxide crystal grains, wherein the zinc oxide-based sputtering target has a degree of (002) orientation of 50% or greater at a sputtering surface and has a density of 5.40 g/cm³ or greater, wherein the crystal grains have an aspect ratio of 5.0 or less in a cross-section perpendicular to the sputtering surface.

2. The zinc oxide-based sputtering target according to claim 1, wherein the degree of orientation is 75% or greater.

3. The zinc oxide-based sputtering target according to claim 1, wherein the aspect ratio is 4.0 or less.

4. The zinc oxide-based sputtering target according to claim 1, wherein the zinc oxide-based sintered body comprises no less than 100 ppm of Zr.

5. The zinc oxide-based sputtering target according to claim 1, wherein the zinc oxide-based sintered body comprises no less than 10 ppm of Na.

* * * * *